United States Patent [19]
Dinteman

[11] Patent Number: 6,084,930
[45] Date of Patent: Jul. 4, 2000

[54] TRIGGERED CLOCK SIGNAL GENERATOR

[75] Inventor: Bryan J. Dinteman, Canby, Oreg.

[73] Assignee: Credence Systems Corporation, Fremont, Calif.

[21] Appl. No.: 09/154,329

[22] Filed: Sep. 16, 1998

[51] Int. Cl.$^7$ ..................................................... H04L 7/00
[52] U.S. Cl. ........................ 375/354; 375/371; 375/377; 713/503
[58] Field of Search .................................. 375/354, 362, 375/365, 368, 377, 371; 713/400, 401, 500, 503

[56] References Cited

U.S. PATENT DOCUMENTS

| | | |
|---|---|---|
| 3,928,813 | 12/1975 | Kingsford-Smith . |
| 5,712,883 | 1/1998 | Miller et al. ............................. 375/371 |
| 5,764,710 | 6/1998 | Cheng et al. ............................ 375/371 |
| 5,790,609 | 8/1998 | Swoboda ................................. 375/371 |
| 5,956,374 | 9/1999 | Iwamatsu ................................ 375/371 |

*Primary Examiner*—Don N. Vo
*Attorney, Agent, or Firm*—Daniel J. Bedell; Smith-Hill and Bedell

[57] ABSTRACT

A triggered clock signal generator produces a periodic output clock signal (CLOCK3) in response to an input TRIGGER signal, wherein a delay between the TRIGGER signal and the first pulse of the CLOCK3 signal is accurately adjustable. The apparatus includes a period generator and a phase adjuster. The period generator, using a periodic input signal (CLOCK1) as a timing reference, responds to the TRIGGER signal by producing a periodic output clock signal (CLOCK2) in adjustably delayed response to a next pulse of the CLOCK1 signal. The phase adjuster phase shifts the CLOCK2 signal to produce the CLOCK3 signal. The phase adjuster compares the phase of the CLOCK1 signal to the phase of the TRIGGER signal to determine an appropriate amount by which to phase shift the CLOCK2 signal so that the time delay between the TRIGGER signal and the first pulse of the CLOCK3 signal is independent of the phase relation between the TRIGGER and CLOCK1 signals.

23 Claims, 5 Drawing Sheets

TRIGGERED CLOCK SIGNAL GENERATOR

BACKGROUND OF THE INVENTION

1. Field of the Invention

The present invention relates in general to clock signal generators and in particular to a triggered clock signal producing an output signal with an accurately adjustable delay following assertion of a trigger signal.

2. Description of Related Art

Several test instruments may be used concurrently when testing an integrated circuit device under test (DUT). For example a waveform generator may stimulate one terminal of a DUT with a test signal while a digitizer digitizes a resulting DUT output signal appearing at another DUT terminal. In a coherent test system operations of synchronous test instruments are synchronized to a master clock signal.

FIG. 1 illustrates a typical prior art coherent test system employing two test instruments 1 and 2 for carrying out a test on a DUT 3. A period generator 4 provides a clock signal (CLOCKA) as a timing reference to test instrument 1 while another period generator 5 provides another clock signal (CLOCKB) as a timing reference to test instrument 2. The CLOCKA and CLOCKB signals are coherent because they use the same master clock signal (MCLOCK) as a timing reference. Before the start of the test, gates 6 and 7 prevent the MCLOCK signal from reaching period generators 4 and 5 to keep the CLOCKA and CLOCKB signals turned off. A TRIGGER signal, asserted at the start of the test, arms gates 6 and 7 and the leading edge of the next MCLOCK signal pulse enables gates 6 and 7 thereby allowing them to begin delivering the MCLOCK signal to the period generators 4 and 5. Since period generators 4 and 5 begin producing their respective clock signals at the same time, test instruments 1 and 2 begin their test activities concurrently and conduct those activities synchronously thereafter.

In the clock distribution system of FIG. 1 period generators 4 and 5 don't directly start their output CLOCKA and CLOCKB signal streams in response to assertion of the TRIGGER signal but in response to the first MCLOCK signal pulse to arrive after the TRIGGER signal. When the TRIGGER signal happens to arrive at gates 6 and 7 substantially coincident with an edge of an MCLOCK signal pulse, that MCLOCK signal pulse may enable only one of the gates. The other gate may not be enabled until the arrival of the next MCLOCK signal pulse. This can happen when the TRIGGER or MCLOCK signal arrives at the gates 6 and 7 at slightly different times or if gates 6 and 7 have slightly different triggering levels. In such case the CLOCKA and CLOCKB signals will be out of synchronization by a full MCLOCK period. What is needed is a method for resolving this problem.

SUMMARY OF THE INVENTION

An apparatus for producing a triggered clock signal (CLOCK3) in accordance with the invention includes a period generator and a phase adjuster. The period generator, using an input master clock signal (CLOCK1) as a timing reference, begins producing a periodic output signal (CLOCK2) with an adjustable delay (DELAY2) following the first pulse of the CLOCK1 signal occurring after an input TRIGGER signal. The CLOCK2 signal is coherent with the CLOCK1 signal but has a frequency that is an adjustable fraction or multiple of the frequency of the CLOCK2 signal. The phase adjuster measures a delay (DELAY1) between the TRIGGER signal and the next pulse of the CLOCK1 signal and then delays the CLOCK2 signal with a delay equal to P1−DELAY1 to produce an output CLOCK3 signal. This ensures that total delay TD between the TRIGGER signal and the first pulse of the CLOCK3 signal is equal to a known constant (P1+DELAY2) regardless of the phase relationship between the TRIGGER signal and the CLOCK1 signal.

It is accordingly an object of the invention to provide a method and apparatus for producing a triggered clock signal (CLOCK3) in which the first pulse of the clock signal occurs with a predictable delay following an input TRIGGER signal.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates a prior art test system in block diagram form,

FIG. 2 illustrates in block diagram form a triggered timing signal generator in accordance with the present invention, FIG. 3 is a timing diagram illustrating operation of triggered timing signal generator of FIG. 2, FIG. 4 illustrates in block diagram form an embodiment of the period generator of FIG. 2, FIG. 5 is a timing diagram illustrating operation of the period generator of FIG. 4, FIG. 6 illustrates in block diagram form an embodiment of the programmable delay circuit of FIG. 2, FIG. 7 illustrates in block diagram form an embodiment of phase detector of FIG. 2, FIG. 8 illustrates in block diagram form an alternative embodiment of phase detector of FIG. 2, FIG. 9 illustrates in block diagram form a triggered clock signal generator in accordance with a first alternative embodiment of the present invention, FIG. 10 is a timing diagram illustrating operation of the triggered clock signal generator of FIG. 9, and FIG. 11 illustrates in block diagram form a triggered clock signal generator in accordance with a second alternative embodiment of the present invention.

DESCRIPTION OF THE PREFERRED EMBODIMENT(S)

Triggered Clock Signal Generator

Figure 1:
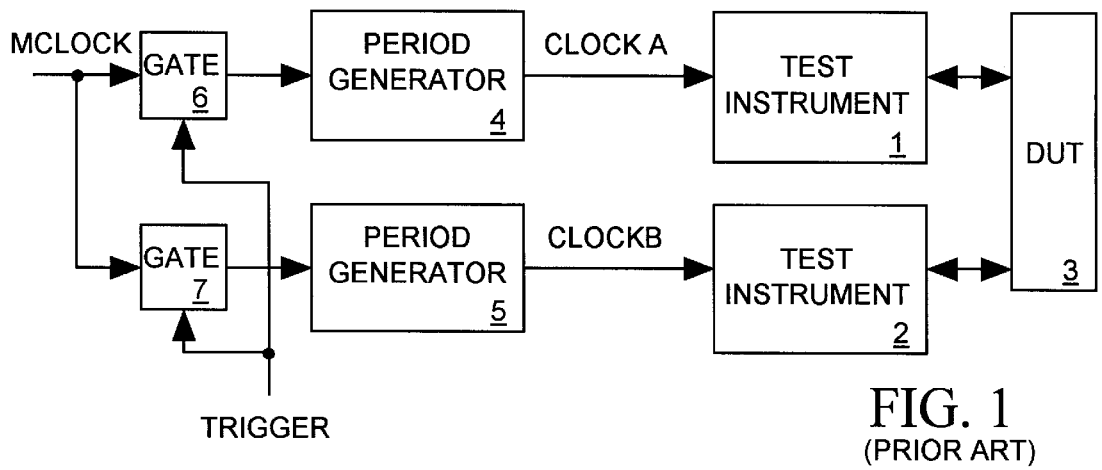
Figure 2:
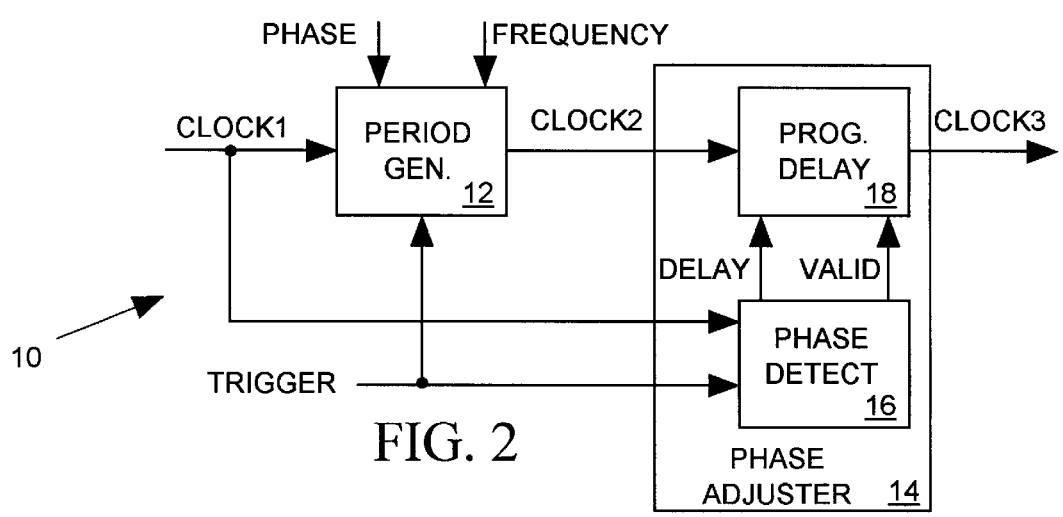

FIG. 2 depicts a triggered clock signal generator 10 in accordance with the present invention which begins producing a periodic output clock signal (CLOCK3) with a predictable delay following assertion of an input trigger signal (TRIGGER). The delay between the TRIGGER and CLOCK3 signal is controlled by input PHASE data. Input FREQUENCY data controls the frequency of the output CLOCK3 signal as an adjustable multiple or fraction of an input reference clock signal (CLOCK1) having a fixed period P1.

Clock signal generator 10 includes a period generator 12, and a phase adjuster 14 including a phase detector 16 and a programmable delay circuit 18. The TRIGGER signal and a periodic reference signal (CLOCK1) each provide inputs to period generator 12 and to phase detector 16. Period generator 12 responds to the TRIGGER signal assertion by producing an output CLOCK2 signal. Delay circuit 18 delays the CLOCK2 signal to produce the output CLOCK3 signal. Phase detector 16 measures a delay (DELAY1) between the TRIGGER signal and a next pulse of the CLOCK1 signal and determines an amount (P1−DELAY1) by which programmable delay circuit 18 should delay the CLOCK2 signal. Phase detector 16 supplies DELAY data to programmable delay circuit 18 for setting its delay and asserts an output signal VALID to indicate when the DELAY data is valid.

Figure 3:
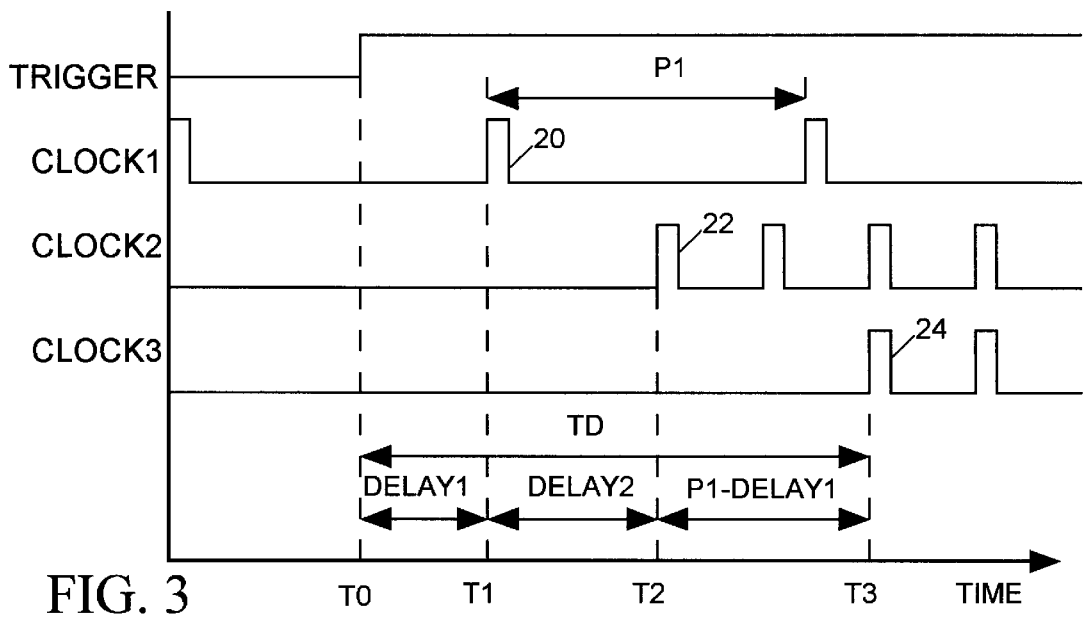

FIG. 3 is a timing diagram illustrating an example of signal timing relationships with apparatus 10 of FIG. 2. Referring to FIGS. 2 and 3, since the timing of the TRIGGER signal assertion may be independent of the CLOCK1 signal, there is an unpredictable delay (DELAY1) between time T0 when the TRIGGER signal is asserted and time T1 at which the edge of a next pulse 20 of the CLOCK1 signal appears. The TRIGGER signal arms period generator 12, telling it to begin producing the CLOCK2 signal after receiving the next pulse 20 of the CLOCK1 signal appearing at time T1. Period generator 12 begins producing the CLOCK2 signal at time T2. The FREQUENCY data input to period generator 12 controls the frequency of the CLOCK2 signal while the PHASE data input controls a delay (DELAY2) between the pulse 20 of the CLOCK1 signal and the first pulse 22 of the CLOCK2 signal.

Phase detector 16 measures the delay (DELAY1) between the leading edge of the TRIGGER signal and the edge of next CLOCK1 signal pulse 20. It then supplies control data (DELAY) to delay circuit 18 adjusting its delay to P1−DELAY1 where P1 is the period of the CLOCK1 signal. Thus the total delay (TD) between the TRIGGER signal and the first pulse 24 of the CLOCK3 signal is $$TD = DELAY1 + DELAY2 + (P1 - DELAY1) = P1 + DELAY2$$

Regardless of the phase relationship between the TRIGGER signal and timing reference signal CLOCK1, the total delay TD between CLOCK3 and the TRIGGER signal is equal to the fixed period P1 of the CLOCK1 signal plus a variable DELAY2 set by the PHASE data. The phase data is used to calibrate the value of total delay TD.

While in the preferred embodiment phase adjuster 14 delays the CLOCK2 signal by P1−DELAY1 to produce the CLOCK3 signal, it could delay the CLOCK2 signal by X−DELAY1 where X is any fixed delay equal to or greater than P1. Although increasing X above P1 would increase the total delay TD between the TRIGGER signal and the CLOCK3 signal, that delay would still be predictable and independent of the timing of the TRIGGER signal relative to the CLOCK1 signal.

Period Generator

Figure 4:
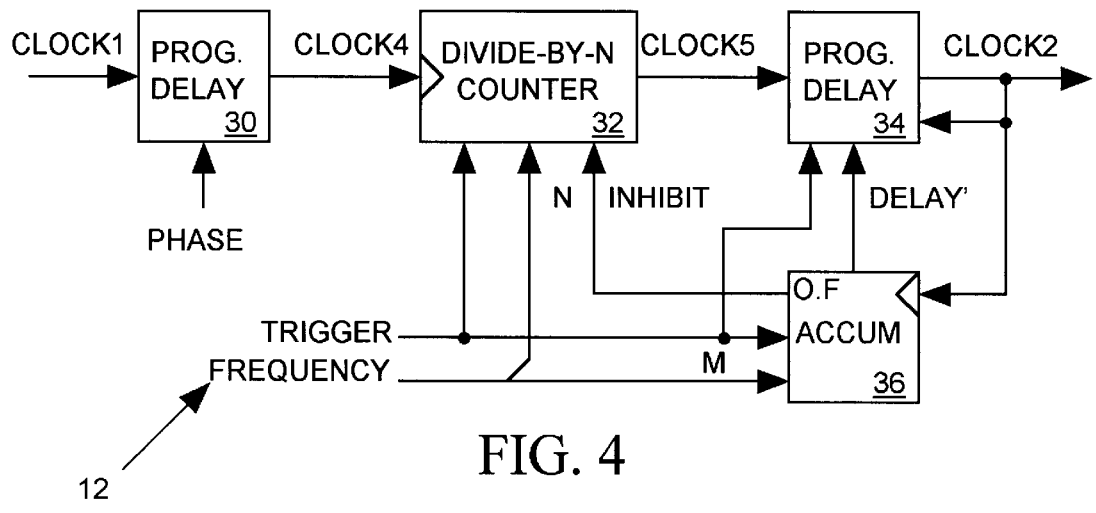

FIG. 4 illustrates period generator 12 of FIG. 2 in more detailed block diagram form. Period generator 12 includes a pair of programmable delay circuits 30 and 34, a divide-by-N counter 32, and an accumulator 36. Programmable delay circuit 30 delays the CLOCK1 signal by an amount indicated by the input PHASE data to produce a signal CLOCK4. Divide-by-N counter 32 does not pulse its output CLOCK5 signal when the TRIGGER signal is low, but when the TRIGGER signal is high, divide-by-N counter 32 frequency divides the CLOCK4 signal by an integer value N (a field of the input FREQUENCY data) to produce a CLOCK5 signal. A leading edge of the TRIGGER signal resets the count of divide-by-N counter 32 to N−1 so that it produces a CLOCK5 signal pulse in response to the ext CLOCK4 pulse occurring after the TRIGGER signal edge. Thus divide-by-N counter 32 resets the phase of the CLOCK5 signal in response to each pulse of the TRIGGER signal so that the next pulse of the CLOCK5 signal follows the TRIGGER signal pulse by not more than one cycle of the CLOCK1 signal.

After receiving a pulse of an input INHIBIT signal, divide-by-N counter 32 refrains from generating its next CLOCK5 output signal pulse. Programmable delay circuit 34 delays each CLOCK5 signal pulse to produce a pulse of the CLOCK2 signal. Delay circuit 34 can delay the CLOCK5 signal from 0 to ⅞th of the CLOCK4 period in steps of ⅛th period, with the delay being selected by data (DELAY') generated by accumulator 36. On the leading edge of each pulse of the CLOCK2 signal, accumulator 36 increments the DELAY' data value by an amount M, another field of the FREQUENCY data having a range of 0–7. The DELAY' data also has a range of 0–7. Programmable delay circuit 34 loads the DELAY' data on the trailing edge of each CLOCK2 pulse. Whenever the DELAY' data output of accumulator 36 overflows, the accumulator asserts the INHIBIT signal to prevent divide-by-N counter 32 from generating its next output CLOCK6 pulse. The leading edge of the TRIGGER signal resets the DATA' data output of accumulator 36 to zero and also sets programmable delay circuit 34 to its minimum delay.

Figure 5:
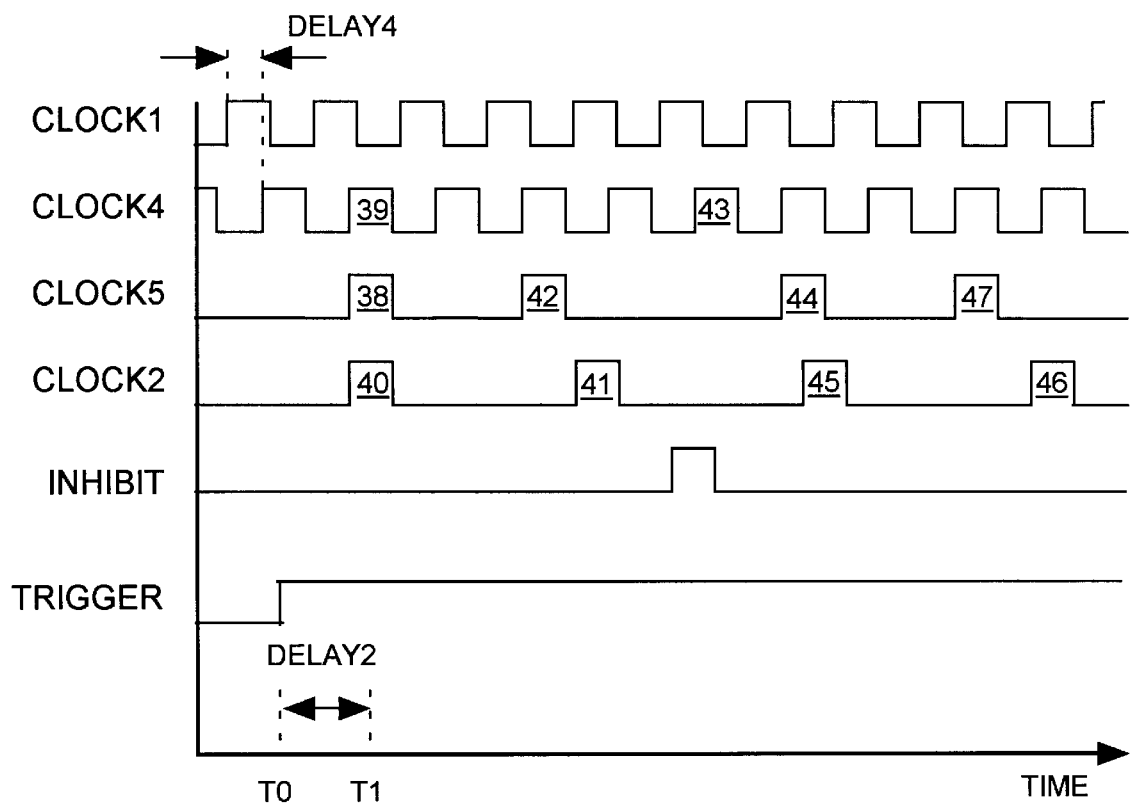

FIG. 5 is a timing diagram illustrating timing relationships between the signals of the period generator FIG. 4 in an example where N is 2 and M is 5. The continuous CLOCK4 signal has a frequency matching that of the CLOCK1 signal but is delayed by an amount (DELAY4) controlled by the PHASE data input to programmable delay circuit 30. After the TRIGGER signal is asserted at time T0, divide-by-N counter 32 resets its count to N−1 and produces the first CLOCK5 signal pulse 38 at time T1 in response to a next occurring CLOCK4 signal pulse 39. Since the TRIGGER signal edge sets delay circuit 34 for 0 delay, the next CLOCK2 pulse 40 also occurs at time T1. On the leading edge of CLOCK2 pulse 40, accumulator 36 increments the DELAY' data value to 5 and on the trailing edge of CLOCK2 pulse 40, programmable delay circuit 34 loads the new DATA1 value. The second CLOCK2 pulse 41 is therefore delayed from the second CLOCK5 pulse 42 by ⅝ths of the CLOCK4 pulse cycle. On the leading edge of CLOCK2 pulse 41, accumulator 36 overflows and pulses the INHIBIT signal thereby inhibiting divide-by-N counter 32 from counting a next CLOCK4 signal pulse 43. With the DATA' value overflowing to a value of 2, delay circuit 34 delays a next pulse 44 of the CLOCK5 signal by ⅔th of a CLOCK4 period to produce the next pulse 45 of the CLOCK2 signal. The trailing edge of CLOCK2 pulse 45 signals accumulator 36 to increment the DELAY' data to 7 so that the next pulse 46 of the CLOCK5 signal appears ⅞ths of the CLOCK4 period following a next pulse 47 of the CLOCK5 signal.

Thus as may be seen from FIG. 5, period generator 12 changes the phase of the CLOCK2 signal after receiving the TRIGGER signal edge, so that the next pulse of the CLOCK2 signal occurs with a delay DELAY2=T1−T0 controlled by the PHASE data input to programmable delay circuit 30. Phase adjuster 14 of FIG. 2 compensates for that variable portion of the delay so that the first pulse CLOCK3 signal after the TRIGGER signal occurs with a predictable delay after the TRIGGER signal. Note that the frequency of the CLOCK2 signal can be either a multiple or a fraction of the CLOCK1 signal frequency (1/P1) depending on the values of N and M fields of the FREQUENCY data.

Programmable Delay Circuit

Figure 6:
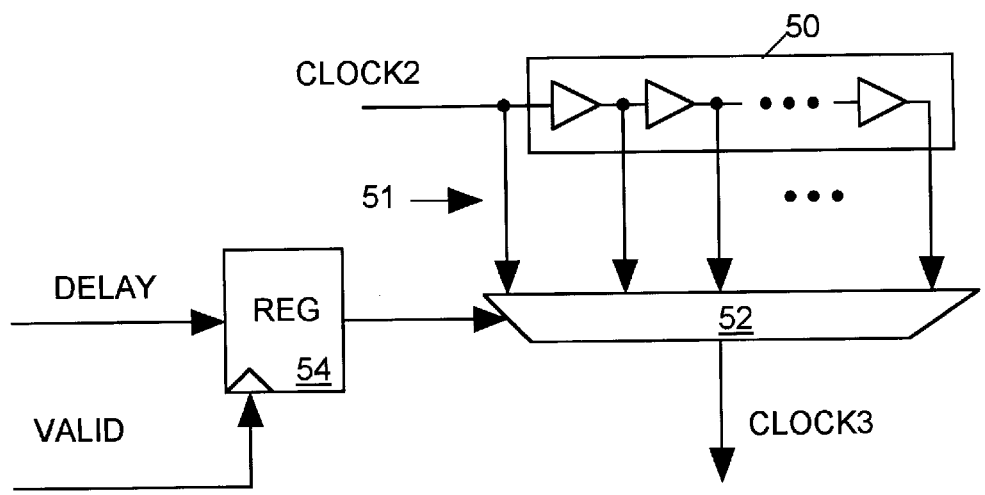

FIG. 6 illustrates a suitable implementation of programmable delay circuit 18 of FIG. 2 in more detailed block diagram form. Delay circuit 18 includes a tapped delay line 50 for delaying the CLOCK2 signal to produce a set of tap signals 51 evenly distributed in phase over one CLOCK2 cycle. Tap signals 51 provide inputs to a multiplexer 52 which selects one of tap signals 51 as delay circuit 18 output signal CLOCK3. The VALID data output of phase detector 16 of FIG. 2 loads the DELAY data output of phase detector 16 into a register 54. The contents of register 54 control the tap selected by multiplexer 52 thereby determining the delay between CLOCK2 and CLOCK3. Delay circuits similar to that shown in FIG. 4 may be employed as programmable delay circuits 30 or 34 of FIG. 4. Those skilled in the art will understand that while FIG. 6 describes a preferred implementation of delay circuits 18, 30 and 34, these delay circuits could be implemented by other kinds of well-known programmable delay circuits.

Phase Detector

Figure 7:
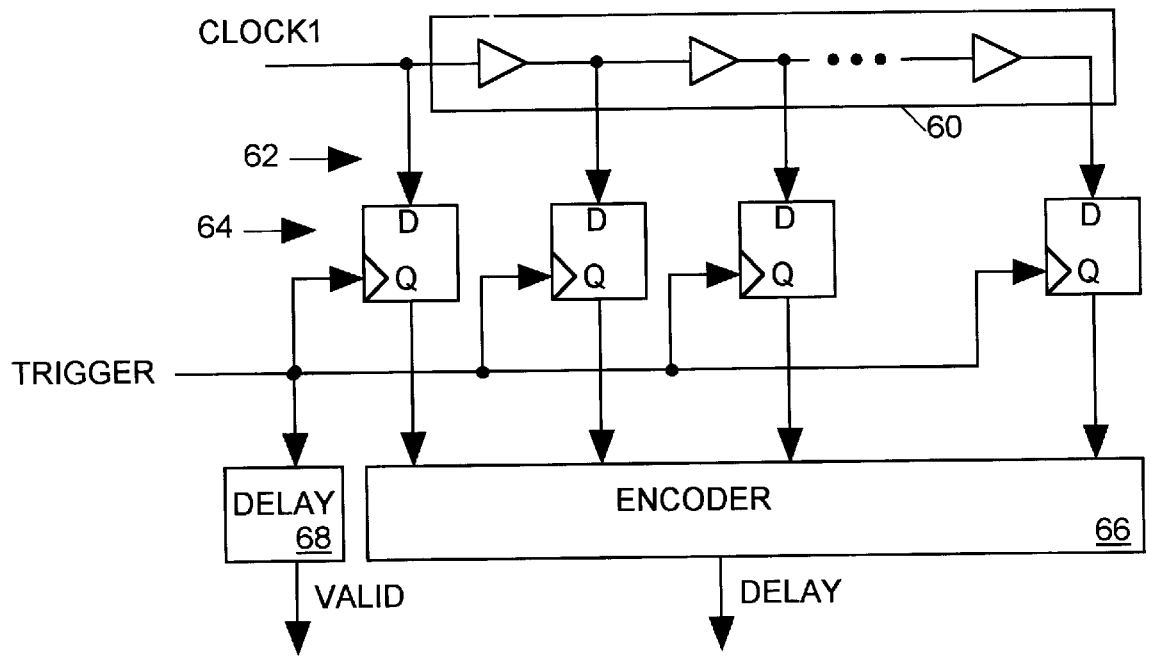

FIG. 7 illustrates a suitable implementation of phase detector 16 of FIG. 2 in more detailed block diagram form. Phase detector 16 measures the delay (DELAY1) between the leading edge of the TRIGGER signal and the leading edge of the next CLOCK1 signal pulse. Detector 16 then determines the amount of compensating delay programmable delay circuit 18 of FIG. 2 should provide (P1−DELAY1) and then sends the appropriate DELAY data to delay circuit 18.

Phase detector 16 includes a tapped delay line 60 having a total delay of P1*(N−1/N) where P1 is the CLOCK1 signal period and N is the number of delay stages forming delay line 60. Delay line 60 progressively delays the CLOCK1 signal to produce a set of N tap signals 62 each applied to a separate D input of a type D flip-flop 64 clocked by the TRIGGER signal. The leading edge of the TRIGGER signal clocks the D input of each flip-flop 64 onto its Q output. Since delay line 60 has a total delay less than the period of the CLOCK1 signal, only one CLOCK1 signal pulse can be in the process of passing though delay line 60. The Q data outputs of flip-flops 64 thus represent the amount (DELAY1) by which the TRIGGER signal leads a next CLOCK1 pulse.

The Q output of each flip-flop 64 provides a separate input to an encoder 66 which produces the DELAY data input to programmable delay circuit 18 of FIG. 2 setting its delay to a value P1−DELAY1. Delay lines 50 and 60 of FIGS. 6 and 7 are suitably identical, having the same number of stages with the same total delay. Thus encoder 66 simply determines which tap 62 of delay line 60 the leading edge of the CLOCK1 signal pulse reached when the TRIGGER signal clocked flip-flops 64 and then sets the DELAY data so that multiplexer 52 of FIG. 6 selects the corresponding tap 51 of delay line 50. A delay circuit 68 briefly delays the TRIGGER signal to produce the VALID signal output of phase detector 16, allowing encoder 66 enough time to encode the DELAY data and deliver it to the programmable delay circuit 18 of FIG. 2 before the VALID signal is asserted.

The resolution by which phase detector 16 measures DELAY1 and by which delay circuit 18 sets the compensating DELAY3 can be improved by increasing the number of stages of delay lines 50 and 60 of FIGS. 6 and 7. In applications requiring a high degree of resolution, the signal path length between the TRIGGER signal source and the clock input of each flip-flop 64 should be uniform so that the TRIGGER signal arrives at all flip-flops concurrently.

Alternative Phase Detector

Figure 8:
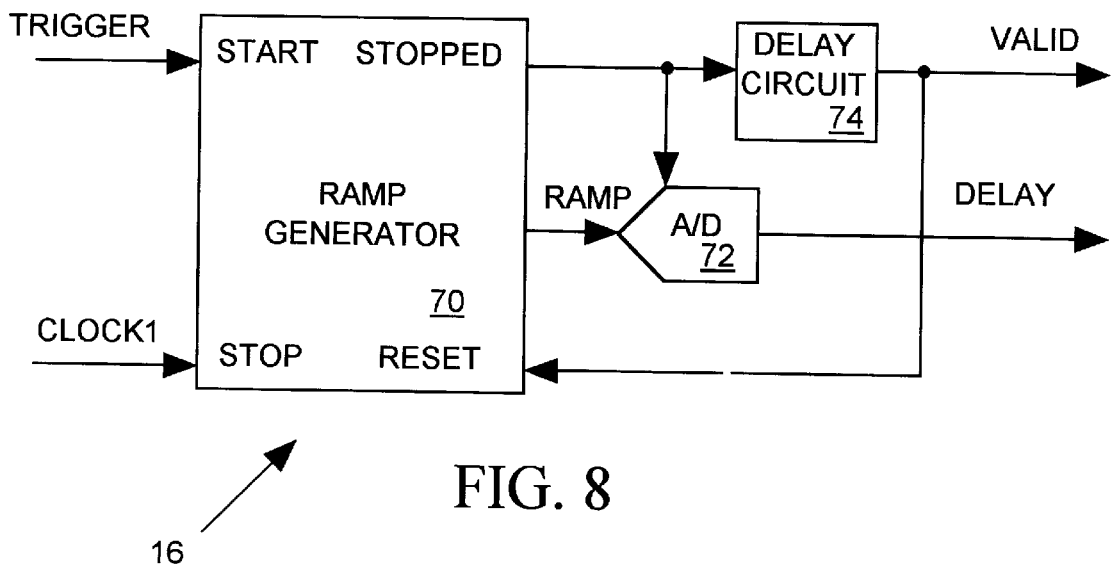

FIG. 8 illustrates an alternative embodiment of phase detector 16 of FIG. 2 employing a ramp generator 70, and analog-to-digital (A/D) converter 72 and a delay circuit 74. The TRIGGER signal drives a START signal input of ramp generator 70 causing it to start linearly decreasing the magnitude of its output ramp signal (RAMP). The next CLOCK1 signal pulse stops the RAMP generator from increasing the RAMP signal. RAMP generator 70 de-asserts a STOPPED signal on receipt of the TRIGGER signal and re-asserts the STOPPED signal on receipt of the first CLOCK1 pulse thereafter. The magnitude of the RAMP signal may range between a high level corresponding to a maximum delay of that programmable delay circuit 18 of FIG. 2 can provide and a low level indicating delay of zero. A/D converter 72 converts the magnitude of the RAMP signal to the appropriate DELAY data value in response to the STOPPED signal. Delay circuit 74 delays the STOPPED signal to produce the VALID signal input to programmable delay circuit 18 of FIG. 2. The delay of delay circuit 74 ensures that the DELAY data output of A/D converter 72 is valid.

First Alternative Triggered Clock Signal Generator

Figure 9:
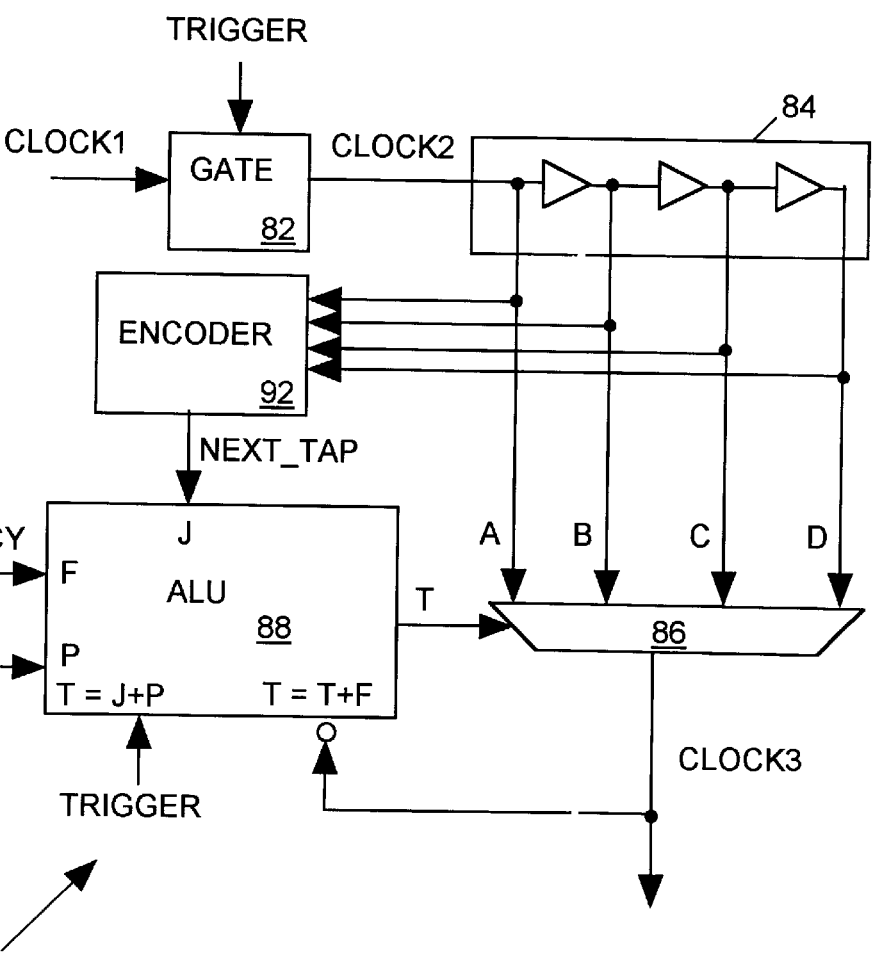

FIG. 9 illustrates a triggered clock signal generator 80 in accordance with an alternative embodiment of the invention, which like triggered clock signal generator 10 of FIG. 2 produces an output signal CLOCK3 with a fixed delay following assertion of an input TRIGGER signal. However in clock signal generator 80 the functions of period generator 12 and phase adjuster 14 of 10 of FIG. 2 are merged.

Figure 11:
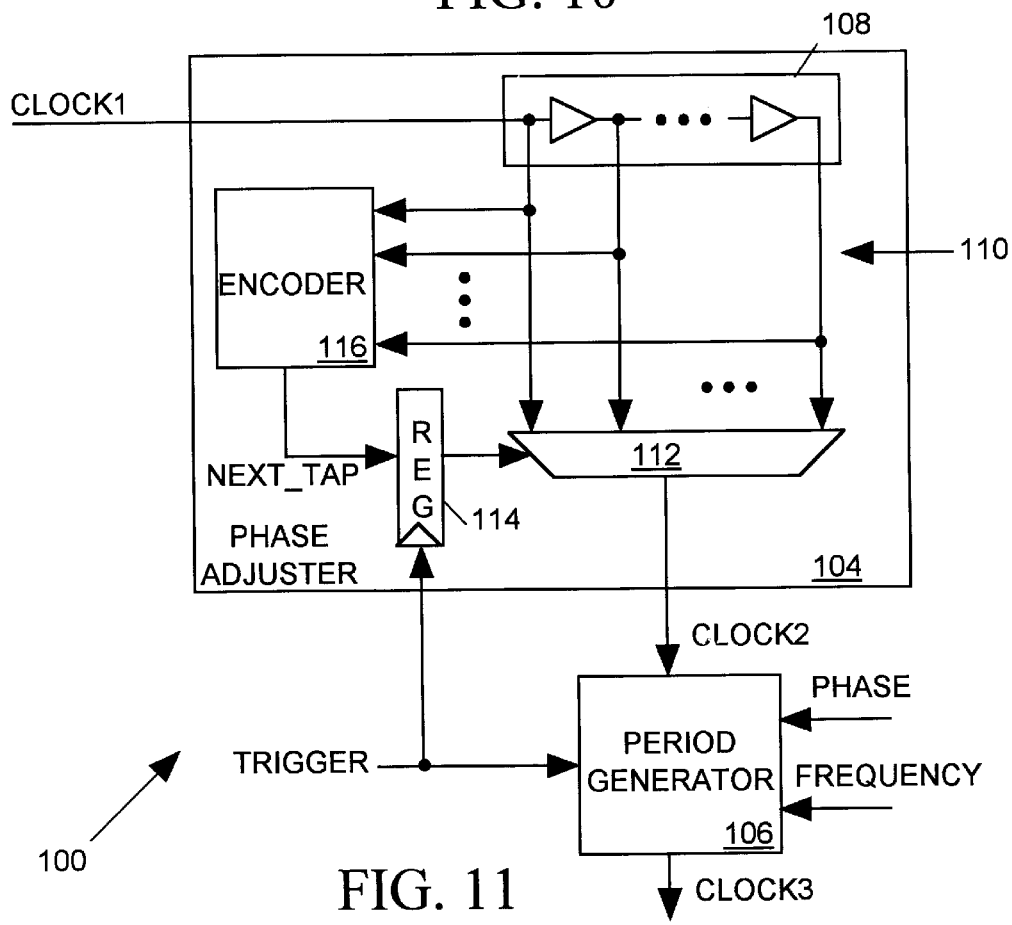

Referring to FIG. 9, the reference clock signal (CLOCK1) and the TRIGGER signal are applied to a gate circuit 82. When the TRIGGER signal is low, gate circuit 82 holds its output signal (CLOCK2) low. Assertion of the TRIGGER signal arms gate circuit 82 so that on the first CLOCK1 pulse thereafter gate circuit 82 it begins providing its input CLOCK1 signal as its output CLOCK2 signal. The CLOCK2 signal drives a tapped delay line 84. For simplicity of discussion delay line 84 is shown in the example of FIG. 11 as having only three delay stages and producing only four output tap signals A–D although those skilled in the art will appreciate that delay line 84 may have many more delay stages and produce many more tap signals. Each stage of delay line 84 has a delay of P1/(N) where P1 is the period of the CLOCK1 and CLOCK2 signals and N is the number of tap signals. Thus tap signal A–D are evenly distributed in phase. Tap signals A–D are respectively supplied to inputs 0 though 3 of a multiplexer 86. Multiplexer 86, controlled by the data output T of an arithmetic logic unit (ALU) 88, selects one of tap signals A–D as its CLOCK3 signal output depending on the value of T. An encoder 92 monitors output tap signals A–D of delay line 84 and supplies a NEXT_TAP data value to an input J of ALU 88 indicating which of taps A–D will be asserted next. Since delay line 84 has a total delay that is less than one CLOCK2 period, only one CLOCK2 pulse passes through delay line 84 at any moment. The encoder 92 is able to determine which tap signal will be next asserted from the current states of tap signals A–D. Input FREQUENCY and PHASE data values drive F and P inputs of ALU 88, respectively. ALU 88 also has control inputs receiving the TRIGGER signal and the CLOCK3 signal. When the TRIGGER signal is asserted, ALU 88 sets T equal to the sum of J+P. On the trailing edge of a CLOCK3 signal pulse, ALU 88 increments T by F.

Figure 10:
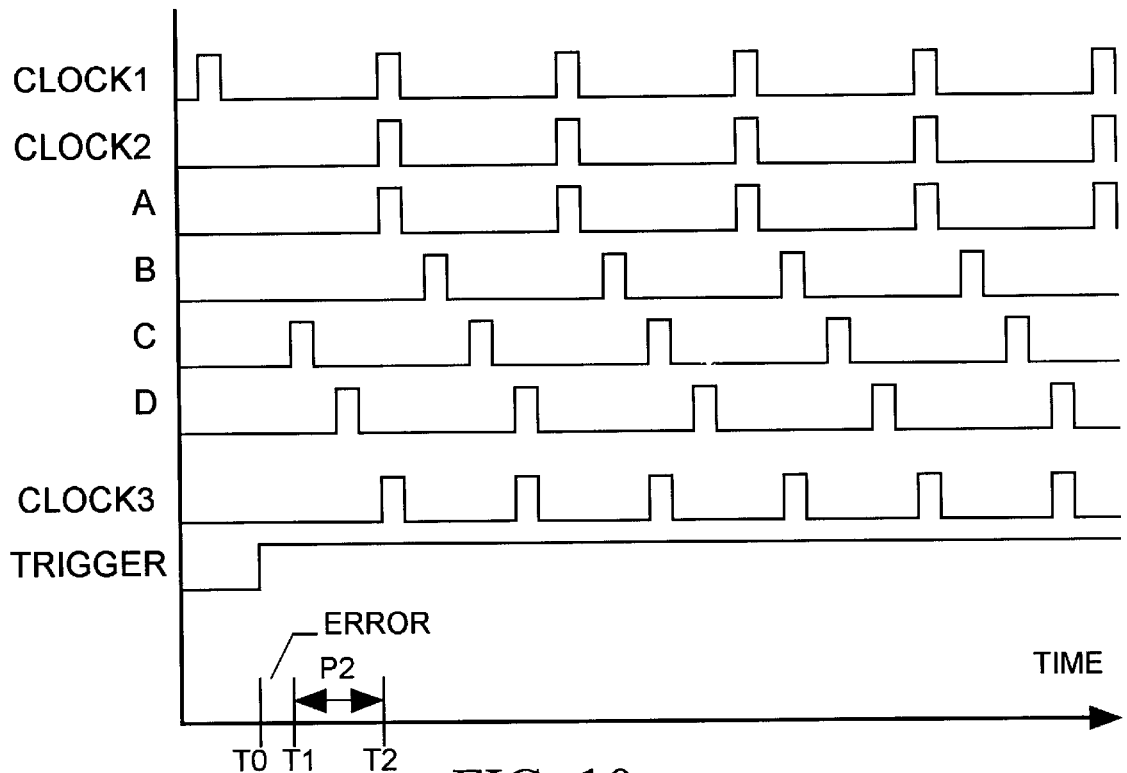

FIG. 10 illustrates signal timing relationships within triggered timing signal generator 80 of FIG. 9 where the FREQUENCY data has value 3 and the PHASE data has value 2. At time T0 when the TRIGGER signal is asserted, the NEXT_TAP output of encoder 92 supplies a 2 to the J input of ALU 88 to indicate that next tap signal to be asserted will be tap signal C. The TRIGGER signal thus causes ALU to set the value of T to J+P. Since J and P are both equal to 2, and since the maximum value of T is 3, the T output of ALU 88 overflows to 0 causing multiplexer 86 to select tap signal A. On the leading edge of the tap signal A at time T2, multiplexer 86 begins producing the first pulse of the CLOCK3 signal. Subsequent pulses of the CLOCK3 signal appear periodically. Since the FREQUENCY data sets the value of F to 3, ALU 88 increments T by 3 on the trailing edge of each CLOCK3 pulse. Thus the CLOCK3 signal period is ¾th the period P1 of the CLOCK1 signal.

The total time delay between assertion of the TRIGGER signal at time T0 and the first pulse of the CLOCK3 signal at time T2 has two components, P2 and an error delay (ERROR). P2 is the delay between the first tap signal pulse occurring after the TRIGGER signal and the first pulse of the CLOCK3 signal. The P2 delay is controlled by the PHASE data input to ALU 88 with a resolution of P1/N where N is the number of tap signal provided by delay line 108 and P1 is the period of the CLOCK1 signal. We would like the delay between TRIGGER and the first CLOCK3 pulse to be equal to P2. However the actual delay is P2+ERROR where ERROR is the time delay between T0 and T1. Thus the ERROR delay between T0 and T1 is the phase error of the CLOCK3 signal relative to the TRIGGER signal. In this example, where delay line 84 has N=4 taps, the maximum phase error will be one fourth of the period of the CLOCK1 signal. As the number of taps of delay line 84 increase, the maximum phase error decreases. For example if delay line 84 has 16 taps, the maximum phase error will be P1/16. Thus the resolution with which the PHASE data input to apparatus 80 of FIG. 11 can select a desired delay between TRIGGER and CLOCK3 is equal to the period of the CLOCK1 signal divided by the number N of taps of delay line 84.

Second Alternative Triggered Clock Signal Generator

FIG. 11 illustrates a triggered timing signal generator 100 in accordance with a second alternative embodiment of the invention. Timing signal generator 100 includes a phase adjuster circuit 104 which delays an input reference clock signal (CLOCK1) to produce a CLOCK2 signal input to a period generator 106. Period generator 106, suitably similar to period generator 12 of FIG. 2, produces a periodic output signal CLOCK3 in response to a TRIGGER signal input. Input FREQUENCY and PHASE data control the frequency of the CLOCK3 signal and the phase of the CLOCK3 signal relative to the CLOCK2 signal.

Phase adjuster circuit 104 responds to the TRIGGER signal by shifting the phase of the CLOCK1 signal so that the next pulse of the CLOCK2 signal appears soon after the TRIGGER signal. Phase adjuster circuit 104 may be similar to phase adjuster circuit 14 of FIG. 2. However in the embodiment of FIG. 11, phase adjuster circuit 104 includes a tapped delay line 108 driven by the CLOCK1 signal for supplying a set of distributed phase tap signals 110 to a multiplexer 112. Each delay element of delay line 108 provides a delay of P1/N where P1 is the period of the CLOCK1 signals and N is the number of tap signals. Multiplexer 112 selects one of tap signals 110 as its CLOCK2 output signal in response to control data stored in a register 114. An encoder 116 monitors tap signals 110 and produces output data (NEXT_TAP) indicating which of tap signal 110 is to be asserted next. Register 114 loads the NEXT_TAP data output of encoder 116 when the TRIGGER signal is asserted. That NEXT_TAP data causes multiplexer 112 to select the particular tap signal 110 that will provide a pulse in the CLOCK2 signal most closely following the TRIGGER signal. The uncertainty in the delay between the TRIGGER signal and the next pulse of the CLOCK3 signal is equal to the period of the CLOCK1 signal divided by the number N of tap signal outputs of delay line 108. The PHASE data input to period generator 106 therefore sets the total delay between the TRIGGER signal and the first pulse of the CLOCK3 signal with a resolution of P1/N.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for receiving a periodic CLOCK1 signal and a TRIGGER signal for producing a periodic CLOCK3 signal beginning with a predictable delay following said TRIGGER signal, the apparatus comprising:

a period generator (12) receiving said CLOCK1 signal for generating in response thereto a periodic CLOCK2 signal, and a phase adjuster (14) receiving said TRIGGER signal, the CLOCK1 signal and the CLOCK2 signal, for delaying said CLOCK2 signal by a delay time determined in response to a measured delay time (DELAY1) between said TRIGGER signal and a next pulse of said CLOCK1 signal occurring after said TRIGGER signal thereby to produce said CLOCK3 signal.

2. The apparatus in accordance with claim 1 wherein said delay time by which said phase adjuster delays said CLOCK2 is equal to a difference between a constant delay time (P1) and said measured delay time (DELAY1).

3. The apparatus in accordance with claim 1 wherein said period generator comprises:

a first programmable delay circuit (30) for adjustably delaying said CLOCK1 signal to produce a CLOCK4 signal with a delay determined by input data (PHASE), a counter (32) receiving said CLOCK4 signal, for producing a pulse of an output CLOCK5 signal in response to a first CLOCK4 signal pulse following assertion of said TRIGGER signal and for producing additional pulses of said CLOCK5 signal periodically thereafter except when inhibited from doings so by an input INHIBIT signal, a second programmable delay circuit (34) for receiving and delaying said CLOCK5 signal by a delay time controlled by a value of input DELAY' data to produce said CLOCK2 signal, and means (36) for responding to said TRIGGER signal by incrementing said DELAY' data by a fixed amount (M) in response to each pulse of said CLOCK2 signal and for asserting said INHIBIT signal input to said counter when said DELAY' data overflows a maximum limit.

4. The apparatus in accordance with claim 1 wherein said phase adjuster comprises, a phase detector (16) receiving said CLOCK1 signal and said TRIGGER signal, for measuring said measured delay (DELAY1) between said TRIGGER signal and said CLOCK1 signal, and for producing DELAY data having a value determined in accordance with said measured delay, and a delay circuit (18) for receiving said DELAY data and delaying said CLOCK2 signal in accordance with said value of said DELAY data.

5. The apparatus in accordance with claim 4 wherein said phase detector comprises:

first delay means (60) for receiving and delaying said CLOCK1 signal to produce a plurality of sequentially asserted first tap signals (62), and means (64, 66) for receiving said first tap signals and for producing said DELAY data in response thereto.

6. The apparatus in accordance with claim 5 wherein said delay circuit comprises:

second delay means (50) for receiving and delaying said CLOCK2 signal to produce a plurality of sequentially asserted second tap signals (51), and a multiplexer (52) for responding to said DELAY data by selecting one of said second signals and providing it as said periodic output CLOCK3 signal.

7. The apparatus in accordance with claim 6 wherein said first and second delay means are substantially similar.

8. The apparatus in accordance with claim 4 wherein said phase detector comprises:

a ramp generator (70) receiving said TRIGGER signal and said CLOCK1 signal for generating a ramp signal (RAMP) in response to said TRIGGER signal, wherein said generator continuously alters a magnitude of said ramp signal after receiving said TRIGGER signal, and means (72) for converting said magnitude of said ramp signal to said DELAY data upon occurrence of a first pulse of said CLOCK1 signal following said TRIGGER signal.

9. An apparatus for receiving a CLOCK1 signal and a TRIGGER signal and for producing a periodic CLOCK3 signal beginning with a predictable delay following said TRIGGER signal, the apparatus comprising:

first delay means (82,84) for receiving and successively delaying said CLOCK1 signal to produce a plurality of sequentially asserted tap signals (A–D), an encoder (92) for monitoring said tap signals and producing NEXT_TAP data of value J indicating which of said tap signals is to be next asserted, a multiplexer (86) for selecting one of said tap signal in accordance with a value T of said input control data to produce said CLOCK3 signal, and logic means (88) receiving said TRIGGER signal, said CLOCK3 signal and said NEXT_TAP data for producing said control data provided as input to said multiplexer, wherein said logic means sets said value T of said control data according to the value J of said NEXT_TAP data in response to said TRIGGER signal, and wherein said logic means alters said value T of said control data in response to a pulse of said CLOCK3 signal.

10. The apparatus in accordance with claim 9 wherein said logic means receives input PHASE data having a value P and wherein said logic means responds to said TRIGGER signal by setting said control data to a value T determined by a sum of J and P.

11. The apparatus in accordance with claim 9 wherein said logic means receives input FREQUENCY data having a value F and wherein said logic means responds to said pulse of said CLOCK3 signal by incrementing said control data value T by F.

12. The apparatus in accordance with claim 9 wherein said logic means receives input PHASE data having a value P and wherein said logic means responds to said TRIGGER signal by setting said control data to a value T determined by a sum of J and P, and wherein said logic means receives input FREQUENCY data having a value F and wherein said logic means responds to said pulse of said CLOCK3 signal by incrementing said control data value T by F.

13. An apparatus for receiving a CLOCK1 signal and a TRIGGER signal for producing a periodic CLOCK3 signal beginning with a predictable delay following said TRIGGER signal, the apparatus comprising:

a phase adjuster (104), receiving said TRIGGER signal and said CLOCK1 signal, for delaying said CLOCK1 signal to produce a CLOCK2 signal, said phase adjuster responding to said TRIGGER signal by phase shifting said CLOCK1 signal so that a next pulse of said CLOCK1 signal occurs with minimal delay following said TRIGGER signal, and a period generator (106) receiving said CLOCK2 signal and said TRIGGER signal, for generating said CLOCK3 signal in delayed response to a first pulse of said CLOCK2 signal occurring after said TRIGGER signal.

14. The apparatus in accordance with claim 13 wherein said period generator comprises:

a first programmable delay circuit (30) for adjustably delaying said CLOCK2 signal to produce a CLOCK4 signal with a delay determined by input data (PHASE), a counter (32) receiving said CLOCK4 signal, for producing a pulse of an output CLOCK5 signal in response to a first CLOCK4 signal pulse following assertion of said TRIGGER signal and for producing additional pulses of said CLOCK5 signal periodically thereafter except when inhibited from doings so by an input INHIBIT signal, a second programmable delay circuit (34) for receiving and delaying said CLOCK5 signal by a delay time controlled by a value of input DELAY' data to produce said CLOCK3 signal, and means (36) for responding to said TRIGGER signal by incrementing said DELAY' data by a fixed amount (M) in response to each pulse of said CLOCK3 signal and for asserting said INHIBIT signal input to said counter when said DELAY' data overflows a maximum limit.

15. The apparatus in accordance with claim 13 wherein said a phase adjuster comprises, delay means (108) for receiving and delaying said CLOCK1 signal to produce a plurality of sequentially asserted tap signals (110), a multiplexer (52) for responding to input NEXT_TAP data by selecting one of said plurality of tap signals and providing it as said periodic output CLOCK3 signal, and means (114,116) receiving said first plurality of sequentially asserted tap signals and said TRIGGER signal, for supplying said NEXT_TAP data to said multiplexer in response to said TRIGGER signal, wherein said NEXT_TAP data indicates a next one of said plurality of tap signals to be asserted by said delay means.

16. A method for producing a periodic CLOCK3 signal beginning with a predictable delay following an input TRIGGER signal, the method comprising the steps of:

generating a periodic CLOCK2 signal in response to a next pulse of an input periodic CLOCK1 signal occurring after said TRIGGER signal, wherein said CLOCK2 signal is coherent with said CLOCK1 signal, delaying said CLOCK2 signal by an amount of time determined in accordance with a measured delay (DELAY1) between said TRIGGER signal and a next occurring pulse of said CLOCK1 signal to produce said CLOCK3 signal.

17. The method in accordance with claim 16 wherein said amount of time by which said CLOCK2 signal is delayed is equal to a constant delay time less said measured delay.

18. The method in accordance with claim 16 wherein the step of generating said periodic CLOCK2 signal comprises the substeps of:

delaying said CLOCK1 signal to produce a CLOCK4 signal with a delay determined by input PHASE data, and producing a pulse of an output CLOCK5 signal in response to a first CLOCK4 signal pulse following assertion of said TRIGGER signal and producing additional pulses of said CLOCK5 signal periodically thereafter in response to said CLOCK4 signal.

19. The method in accordance with claim 16 wherein the step of delaying said CLOCK2 signal by an amount of time determined in accordance with a measured delay (DELAY1) between said TRIGGER signal and a next occurring pulse of said CLOCK1 signal to produce said CLOCK3 signal comprises the substeps of:

delaying said CLOCK1 signal to produce a plurality of sequentially asserted first tap signals, monitoring said first tap signals to determine a phase relationship between said TRIGGER signal and said CLOCK1 signal, delaying said CLOCK2 signal to produce a plurality of sequentially asserted second tap signals, and selecting one of said second tap signals in accordance with the determined phase relationship and providing the selected one of said second tap signals as said periodic output CLOCK3 signal.

20. A method for producing a periodic CLOCK3 signal beginning with a predictable delay following an input TRIGGER signal, the method comprising the steps of:

delaying an input CLOCK1 signal to produce a plurality of sequentially asserted tap signals (A–D), producing NEXT_TAP data of value J indicating which of said tap signals is to be next asserted, selecting one of said tap signal in accordance with a value T of control data to produce said CLOCK3 signal, setting said value T of said control data in response to the value J of said NEXT_TAP data in response to said TRIGGER signal, and altering said value T of said control data in response to a pulse of said CLOCK3 signal.

21. The method in accordance with claim 20 wherein the steps of setting said value T of said control data in response to the value J of said NEXT_TAP data in response to said TRIGGER signal, and altering said value T of said control data in response to a pulse of said CLOCK3 signal comprise the substeps of:

responding to each pulse of said CLOCK3 signal by incrementing said control data value T by a second adjustable constant (F), responding to said TRIGGER signal by setting the control data value T to a sum of said J and a value of input PHASE data.

22. A method for producing a periodic CLOCK3 signal beginning with a predictable delay following an input TRIGGER signal, the method comprising:

delaying a periodic input CLOCK1 signal with an adjustable delay to produce a CLOCK2 signal, adjusting said adjustable delay in response to said TRIGGER signal to phase shift said CLOCK2 such that a next pulse of said CLOCK2 signal occurs immediately following said TRIGGER signal, and generating said CLOCK3 signal in delayed response to said next pulse of said CLOCK2 signal.

23. The method in accordance with claim 22 wherein the steps of delaying a periodic input CLOCK1 signal and adjusting said adjustable delay comprise the steps of:

delaying said CLOCK1 signal to produce a plurality of sequentially asserted tap signals, responding to input NEXT_TAP data by selecting one of said first plurality of tap signals and providing it as said periodic output CLOCK3, and generating said NEXT_TAP data in response to said TRIGGER signal, wherein said NEXT_TAP data indicates a next one of said plurality of tap signals that is to be asserted.

* * * * *